(12) United States Patent
Ryotaro et al.

(10) Patent No.: US 10,107,862 B2
(45) Date of Patent: Oct. 23, 2018

(54) FUEL GAUGE SYSTEM FOR MEASURING THE AMOUNT OF CURRENT IN BATTERY AND PORTABLE ELECTRONIC DEVICE INCLUDING THE SAME

(71) Applicant: Samsung Electronics Co., Ltd., Suwon-si, Gyeonggi-do (KR)

(72) Inventors: Kudo Ryotaro, Seongnam-si (KR); Dong Jin Keum, Suwon-si (KR); Byung Chul Jeon, Seongnam-si (KR); Jin Sub Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 58 days.

(21) Appl. No.: 15/286,765

(22) Filed: Oct. 6, 2016

(65) Prior Publication Data
US 2017/0131358 A1 May 11, 2017

(30) Foreign Application Priority Data
Nov. 5, 2015 (KR) .................... 10-2015-0155318

(51) Int. Cl.
*G01R 31/36* (2006.01)
*G01R 1/20* (2006.01)

(52) U.S. Cl.
CPC ......... *G01R 31/3606* (2013.01); *G01R 1/203* (2013.01)

(58) Field of Classification Search
CPC ...... H02J 7/0016; H02J 7/0031; H02J 7/0021; H02J 7/0029; H02J 7/007; H02J 7/0026;
(Continued)

(56) References Cited

U.S. PATENT DOCUMENTS 3,771,039 A * 11/1973 Stewart .................. H02J 7/022
320/140
5,585,994 A * 12/1996 Tamai .................. H02J 7/0029
323/277
(Continued)

FOREIGN PATENT DOCUMENTS

KR  10-0968350 B1  7/2010

OTHER PUBLICATIONS

EE Times 2012—A Current Sensing Tutorial—Part 1: Fundamentals. pdf.
(Continued)

*Primary Examiner* — Patrick Assouad
*Assistant Examiner* — Demetrius Pretlow
(74) *Attorney, Agent, or Firm* — Harness, Dickey & Pierce, P.L.C.

(57) ABSTRACT

A fuel gauge system for measuring the amount of current in a battery is provided. The fuel gauge system includes a first resistive element connected in series to the battery, a second resistive element connected in series to the first resistive element, a first switch connected in parallel to the second resistive element to control a current flowing in the second resistive element, a second switch connected in series to the second resistive element to control the current flowing in the second resistive element, a controller configured to output a first switching signal to the first switch and output a second switching signal to the second switch, and a fuel gauge circuit configured to measure a battery current flowing in the first resistive element and the second resistive element.

20 Claims, 7 Drawing Sheets

(58) Field of Classification Search
CPC ............ H02J 7/0047; H02J 2007/0039; H02J 2007/0037; G01R 31/3658; G01R 31/3606; G01R 31/3624; G01R 31/3648; G01R 31/3662; G01R 31/362; G01R 31/3679; G01R 19/0092; G01R 19/16542; G01R 1/203
See application file for complete search history.

(56) References Cited

U.S. PATENT DOCUMENTS

| | | | |
|---|---|---|---|
| 5,889,382 | A | 3/1999 | Jung |
| 6,014,030 | A | 1/2000 | Smith et al. |
| 6,680,615 | B2 | 1/2004 | Nebon et al. |
| 6,836,095 | B2 | 12/2004 | Fogg |
| 6,969,974 | B1 * | 11/2005 | Liu .................. G01R 19/16542 320/132 |
| 7,531,989 | B2 | 5/2009 | Maireanu |
| 7,696,727 | B2 | 4/2010 | Choi |
| 8,200,444 | B2 | 6/2012 | Vaingast |
| 8,233,582 | B2 | 7/2012 | Schwoerer |
| 8,319,650 | B2 | 11/2012 | Volodymyr et al. |
| 8,436,583 | B2 | 5/2013 | Guang et al. |
| 8,606,533 | B2 | 12/2013 | Yen |
| 8,717,033 | B2 | 5/2014 | Harrington et al. |
| 2005/0194933 | A1 * | 9/2005 | Arnold .................. H02J 7/0077 320/128 |
| 2006/0267592 | A1 * | 11/2006 | Choi .................... G01R 15/002 324/426 |
| 2011/0274952 | A1 * | 11/2011 | Itagaki ................ G01R 31/362 429/93 |
| 2011/0313698 | A1 * | 12/2011 | Inoue .................... G01R 19/14 702/63 |
| 2013/0045404 | A1 * | 2/2013 | Shi ...................... G01R 31/3606 429/93 |
| 2013/0162199 | A1 * | 6/2013 | Takahashi ............. H01M 10/44 320/107 |
| 2014/0028285 | A1 | 1/2014 | Yu et al. |
| 2015/0369870 | A1 * | 12/2015 | Okada .................. H01M 10/44 324/430 |

OTHER PUBLICATIONS bq27411-G1 Single Cell Li-Ion Battery Fuel Gauge for Battery Pack Integration.pdf.

* cited by examiner

FUEL GAUGE SYSTEM FOR MEASURING THE AMOUNT OF CURRENT IN BATTERY AND PORTABLE ELECTRONIC DEVICE INCLUDING THE SAME

CROSS-REFERENCE TO RELATED APPLICATIONS

This application claims priority under 35 U.S.C. § 119(a) from Korean Patent Application No. 10-2015-0155318 filed on Nov. 5, 2015, the disclosure of which is hereby incorporated by reference in its entirety.

BACKGROUND

Embodiments of the inventive concepts relate to a fuel gauge system, and more particularly, to a fuel gauge system for measuring the amount of current in a battery using a plurality of resistive elements, and to a portable electronic device including the same.

Portable electronic devices using a battery as a power supply typically include a fuel gauge system which measures the amount of current in the battery to estimate the state of charge of the battery. Conventional fuel gauge systems use a method of measuring a voltage of one fixed detection resistive element, and calculating the amount of current based on the measured voltage.

When usual battery current (greater than several hundreds of mA) flows, a voltage applied across both ends of a detection resistive element is greater than an offset voltage of a measurement circuit, so that the amount of current in a battery can be substantially accurately measured using a single fixed detection resistive element. However, when a micro current (less than about 1 mA) flows in a deep sleep mode, a voltage to be measured decreases down to several tens of μV, and a measurement error increases due to the offset voltage of the measurement circuit.

SUMMARY

According to some example embodiments of the inventive concepts, a fuel gauge system is configured to measure the amount of current in a battery. The fuel gauge system includes a first resistive element connected in series to the battery, a second resistive element connected in series to the first resistive element, a first switch connected in parallel to the second resistive element to control a current flowing in the second resistive element, a second switch connected in series to the second resistive element to control the current flowing in the second resistive element, a controller configured to output a first switching signal to the first switch and output a second switching signal to the second switch, and a fuel gauge circuit configured to measure a battery current flowing in the first resistive element and the second resistive element.

The first resistive element may be directly connected to the second resistive element. The fuel gauge circuit may include an amplifier configured to sense potentials of both ends of the first and second resistive elements and an analog-to-digital converter configured to output a digital signal based on a voltage difference received from the amplifier.

The battery may be placed between the first resistive element and the second resistive element. At this time, the fuel gauge circuit may include a first amplifier configured to sense potentials of both ends of the first resistive element, a second amplifier configured to sense potentials of both ends of the second resistive element, a first analog-to-digital converter configured to output a first digital signal based on a first voltage difference received from the first amplifier, and a second analog-to-digital converter configured to output a second digital signal based on a second voltage difference received from the second amplifier.

The controller may enable the first switch and subsequently disable the second switch when the controller receives a mode signal corresponding to a first mode. The controller may enable the second switch after waiting for a desired, or alternatively predetermined time and subsequently disable the first switch when the controller receives a mode signal corresponding to a second mode.

The fuel gauge system may further include a level detector configured to receive potential values of both ends of the first resistive element and potential values of both ends of the second resistive element, to detect a level of the battery current, and to output the mode signal to the controller.

The fuel gauge circuit may further include a scaler configured to scale the digital signal received from the analog-to-digital converter according to scaling information received from the controller. The controller may output the scaling information that has been desired, or alternatively predetermined to the scaler according to the mode signal.

Alternatively, the fuel gauge system may further include a first charging circuit connected to the first switch and a second charging circuit connected to the first resistive element through a different path than the first charging circuit.

Other example embodiments of the inventive concepts relate to a portable electronic device using a battery. The portable electronic device includes a fuel gauge system configured to measure the amount of current in the battery and a plurality of chips connected to the fuel gauge system.

Example embodiments of the inventive relate to a fuel gauge system for measuring the amount of current in a battery. The fuel gauge system includes a first switch connected in series to the battery, a second switch connected in parallel to the first switch, a controller configured to output a first switching signal to the first switch and output a second switching signal to the second switch, and a fuel gauge circuit connected to both ends of the first switch. The first switch may be a transistor that operates as a first resistor when it is enabled, and the second switch may be a transistor which functions as a second resistor, having a greater resistance value than the first resistor, when it is enabled.

The fuel gauge circuit may include an amplifier configured to sense potentials of both ends of the first switch and an analog-to-digital converter configured to output a digital signal based on a voltage difference received from the amplifier.

According to some example embodiments of the inventive concepts, a fuel gauge system is comprising a first switch connected in series to a first resistor and to a battery, and in parallel to a second resistor, a second switch connected in series to the first and second resistors, and in parallel to the first switch, and a fuel gauge circuit connected in parallel to the first and second resistors and configured to measure a battery current flowing in the first resistor and in the second resistor.

BRIEF DESCRIPTION OF THE DRAWINGS

The above and other features and advantages of the inventive concepts will become more apparent by describing in detail example embodiments thereof with reference to the attached drawings in which.

DETAILED DESCRIPTION OF THE EMBODIMENTS

Figure 1:
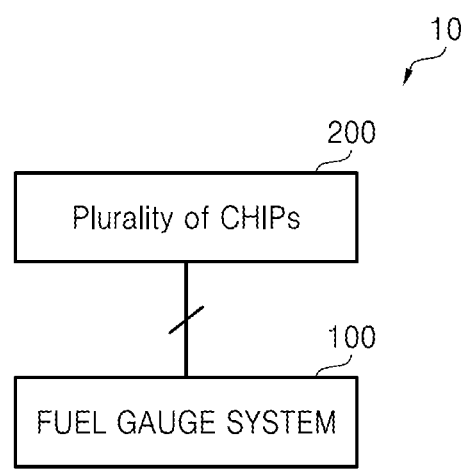
FIG. 1 is a block diagram of a portable electronic device, according to some embodiments of the inventive concepts.

The inventive concepts now will be described more fully hereinafter with reference to the accompanying drawings, in which example embodiments. The various embodiments may, however, be embodied in many different forms and should not be construed as limited to the example embodiments set forth herein. Rather, these example embodiments are provided so that this disclosure will be thorough and complete, and will fully convey the scope of the embodiments to those skilled in the art. In the drawings, the size and relative sizes of layers and regions may be exaggerated for clarity. Like numbers refer to like elements throughout.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the various embodiments. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the various embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram of a portable electronic device 10 according to some example embodiments of the inventive concepts. The portable electronic device 10 may include a fuel gauge system 100 and a plurality of chips 200. The portable electronic device 10 may be implemented, e.g., as a laptop computer, a cellular phone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, a drone, or an e-book.

The fuel gauge system 100 may measure the amount of current in a battery of the portable electronic device 10 which includes a battery power supply. The plurality of chips 200 may include, e.g., a central processing unit (CPU), a graphics processing unit (GPU), an application processor (AP), a memory device, a display device, a sound unit, a communication module, an interface, and so on, which are provided with power by the battery.

Figure 2:
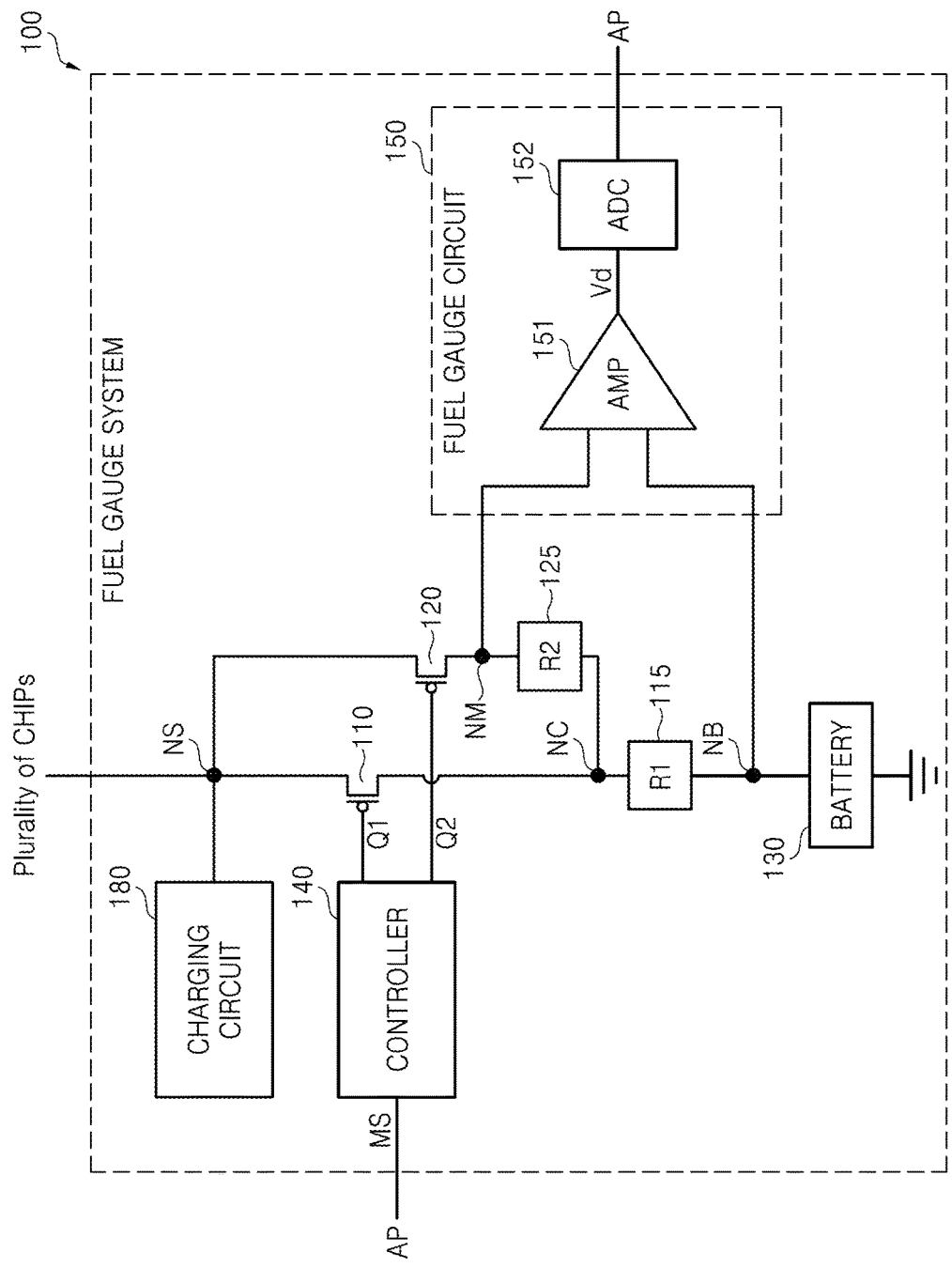
FIG. 2 is a detailed block diagram of a fuel gauge system, according to some embodiments of the inventive concepts.

FIG. 2 is a detailed block diagram of the fuel gauge system 100 according to some example embodiments of the inventive concepts. Referring to FIG. 2, the fuel gauge system 100 may include a first resistive element 115 (R1), a second resistive element 125 (R2), a first switch 110, a second switch 120, a controller 140, a fuel gauge circuit 150, and a charging circuit 180. The fuel gauge system 100 may also include a battery 130.

The first resistive element 115 may be or include a resistor used to measure a charge/discharge current (hereinafter, referred to as a battery current) which flows out of or into the battery 130. Hereinafter, the battery current will be restrictedly described as a discharge current of the battery 130 for convenience' sake in the description. However, the fuel gauge system 100 may also perform the same function during charge with the direction of battery current set in reverse.

The first resistive element 115 may be connected, for example directly connected, in series to the battery 130. The fuel gauge circuit 150 may be connected to a node (hereinafter, referred to as a battery node) NB to which the first resistive element 115 and the battery 130 are connected. When battery current flows through the first resistive element 115 connected in series to the battery 130, a first potential difference V1 is created that is proportional to a battery current Ibat and a resistance value R1 of the first resistive element 115. For example, the first potential difference V1 can be calculated using Equation 1:

$$V1 = Ibat * R1. \quad (1)$$

The second resistive element 125 may be an auxiliary resistor used to measure a battery current. The second resistive element 125 may be connected, for example directly connected, in series to the first resistive element 115. The second resistive element 125 may have a greater resistance value than the first resistive element 115.

When a battery current flows through the first resistive element 115 and the second resistive element 125, which are connected in series to the battery 130, a second potential difference V2 may be created that is proportional to the battery current Ibat, the resistance value R1 of the first resistive element 115, and the resistance value of the second resistive element 125. For example, the second potential difference V2 can be calculated using Equation 2:

$$V2 = Ibat * (R1 + R2). \quad (2)$$

The first switch 110 may be connected in parallel to the second resistive element 125 to control a battery current flowing in the second resistive element 125. The second switch 120 may be connected in series to the second resistive element 125 to control the battery current flowing in the second resistive element 125. The first switch 110 and the second switch 120 may be or include a complementary metal-oxide semiconductor (CMOS), a field effect transistor (FET), or a bipolar junction transistor (BJT).

The first switch 110 may be enabled when a first switching signal Q1 is low. The second switch 120 may be enabled when a second switching signal Q2 is low. In other words, when the first switch 110 is disabled and the second switch 120 is enabled, a battery current may flow in the second resistive element 125. Contrarily, when the first switch 110 is enabled and the second switch 120 is disabled, a battery current may not flow in the second resistive element 125.

The controller 140 may output the first switching signal Q1 to the first switch 110 and the second switching signal Q2 to the second switch 120 to control the turning on/off of the first and second switches 110 and 120 for a substantially accurate measurement of battery current. The controller 140 may receive a mode signal MS from an AP (not shown) or a platform logic (not shown).

The mode signal MS may indicate a first mode when MS is low and may indicate a second mode when MS is high. The mode signal MS may include a first mode signal indicating the first mode or a second mode signal indicating the second mode. The inventive concepts are not restricted to the example embodiments and the mode signal MS may be implemented in various methods. For convenience' sake in the description, the mode signal MS indicates the first mode when MS is low and indicates the second mode when MS is high. A battery current may be in a usual battery current range (i.e., several hundreds of mA) in the first mode and may be in a micro battery current range (i.e., several mA) in the second mode.

The controller 140 may determine that the fuel gauge system 100 changes from the second mode to the first mode when the mode signal MS transits from high to low. The controller 140 may also enable the first switch 110 and then disable the second switch 120 when the fuel gauge system 100 changes from the second mode to the first mode. Contrarily, the controller 140 may determine that the fuel gauge system 100 changes from the first mode to the second mode when the mode signal MS transits from low to high. When the fuel gauge system 100 changes from the first mode to the second mode, the controller 140 may also enable the second switch 120 after waiting for a desired, or alternatively predetermined time Tdly and disable the first switch 110. The desired, or alternatively predetermined time Tdly may be variable.

The fuel gauge circuit 150 may measure a battery current flowing in the first resistive element 115 and the second resistive element 125. The fuel gauge circuit 150 may measure the battery current by measuring a voltage difference between both ends of the first resistive element 115 and the second resistive element 125.

The fuel gauge circuit 150 may include an amplifier 151 and an analog-to-digital converter (ADC) 152, as shown in FIG. 2. The amplifier 151 may be or include a sense amplifier or a buffer. For convenience in the description, it is assumed that the amplifier 151 has an amplification (i.e., Vo/Vi) of 1 (i.e., the amplifier 151 may be a buffer). However, the inventive concepts are not restricted to these example embodiments.

The amplifier 151 may be connected to respective ends of the first and second resistive elements 115 and 125. Here, both ends of the first and second resistive elements 115 and 125 may be a measurement node NM and a battery node NB. The amplifier 151 may sense potentials at the ends of the first and second resistive elements 115 and 125 and output a voltage difference Vd between both ends of the first and second resistive elements 115 and 125 to the ADC 152.

In the first mode, the voltage difference Vd output from the amplifier 151 to the ADC 152 may be the first potential difference V1. The first potential difference V1 is calculated using Equation 1 and may be the same as a potential difference created when a battery current flows in the first resistive element 115. In the example embodiments illustrated in FIG. 2, the first potential difference V1 may be a potential of the battery node NB less a potential of the measurement node NM. Since the battery current does not flow in the second resistive element 125 in the first mode, the potential of the measurement node NM may be the same as the potential of a central node NC. Accordingly, the first potential difference V1 may be the potential of the battery node NB less the potential of the central node NC.

In the second mode, the voltage difference Vd output from the amplifier 151 to the ADC 152 may be the second potential difference V2. The second potential difference V2 is calculated using Equation 2 and may be the same as a potential difference created when a battery current flows in the first resistive element 115 and the second resistive element 125. In the example embodiments illustrated in FIG. 2, the second potential difference V2 may be the potential of the battery node NB less the potential of the measurement node NM. Since the battery current flows in the first resistive element 115 and the second resistive element 125 in the second mode, the potential of the measurement node NM is different from the potential of the central node NC. Accordingly, the second potential difference V2 may be the sum of the potential of the battery node NB less the potential of the central node NC and the potential of the central node less the potential of the measurement node NM.

The ADC 152 may convert the voltage difference Vd received from the amplifier 151 into a digital signal. The ADC 152 may output the digital signal to the AP or the platform logic.

The charging circuit 180 may charge the battery 130 using an external power supply (not shown). When the external power supply is connected to the charging circuit 180, the battery 130 may be charged. At this time, a battery current may flow in a direction opposite to a direction in which a battery current flows when the external power supply is not connected.

Figure 3:
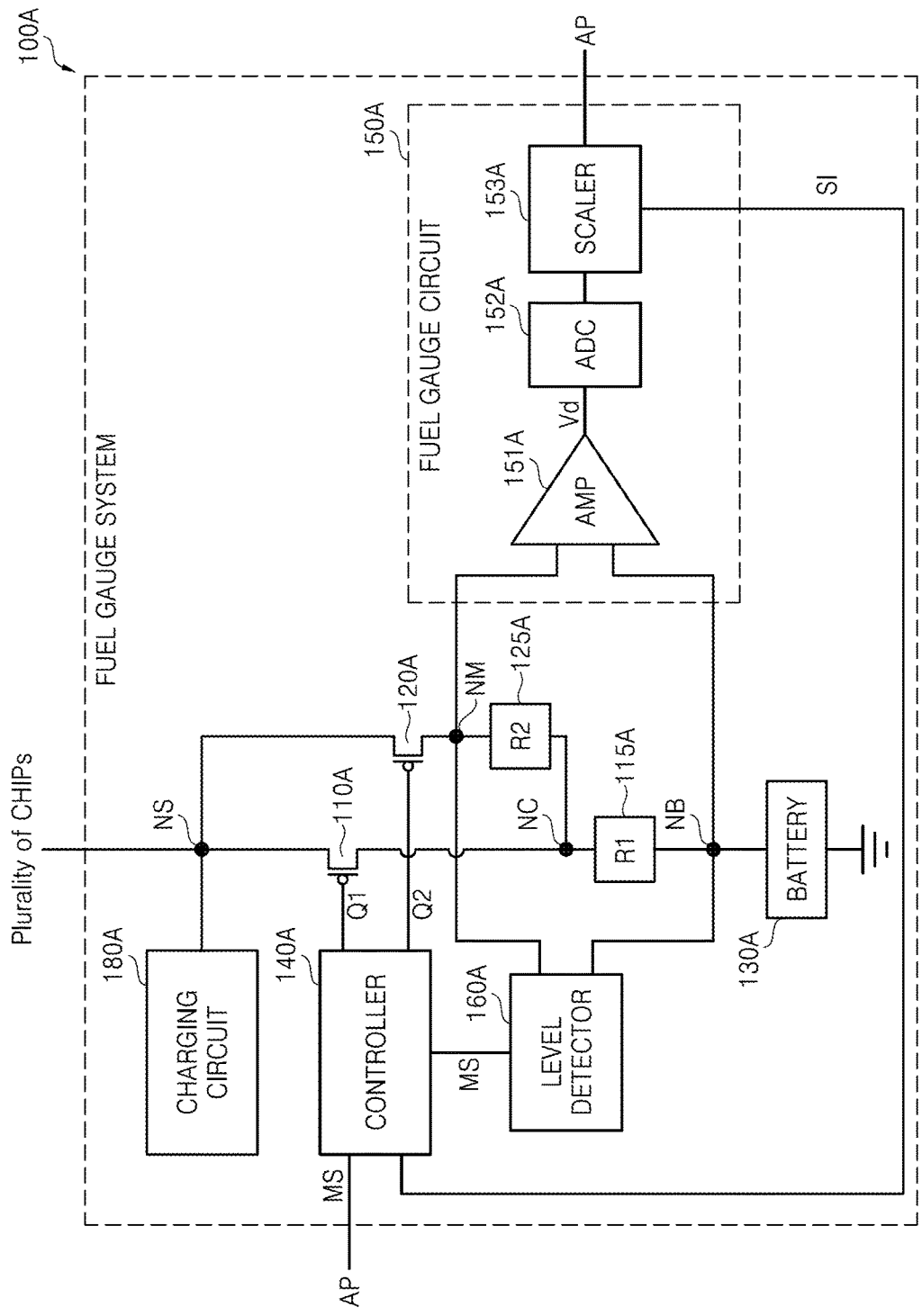
FIG. 3 is a detailed block diagram of a fuel gauge system, according to other embodiments of the inventive concepts.
Figure 4:
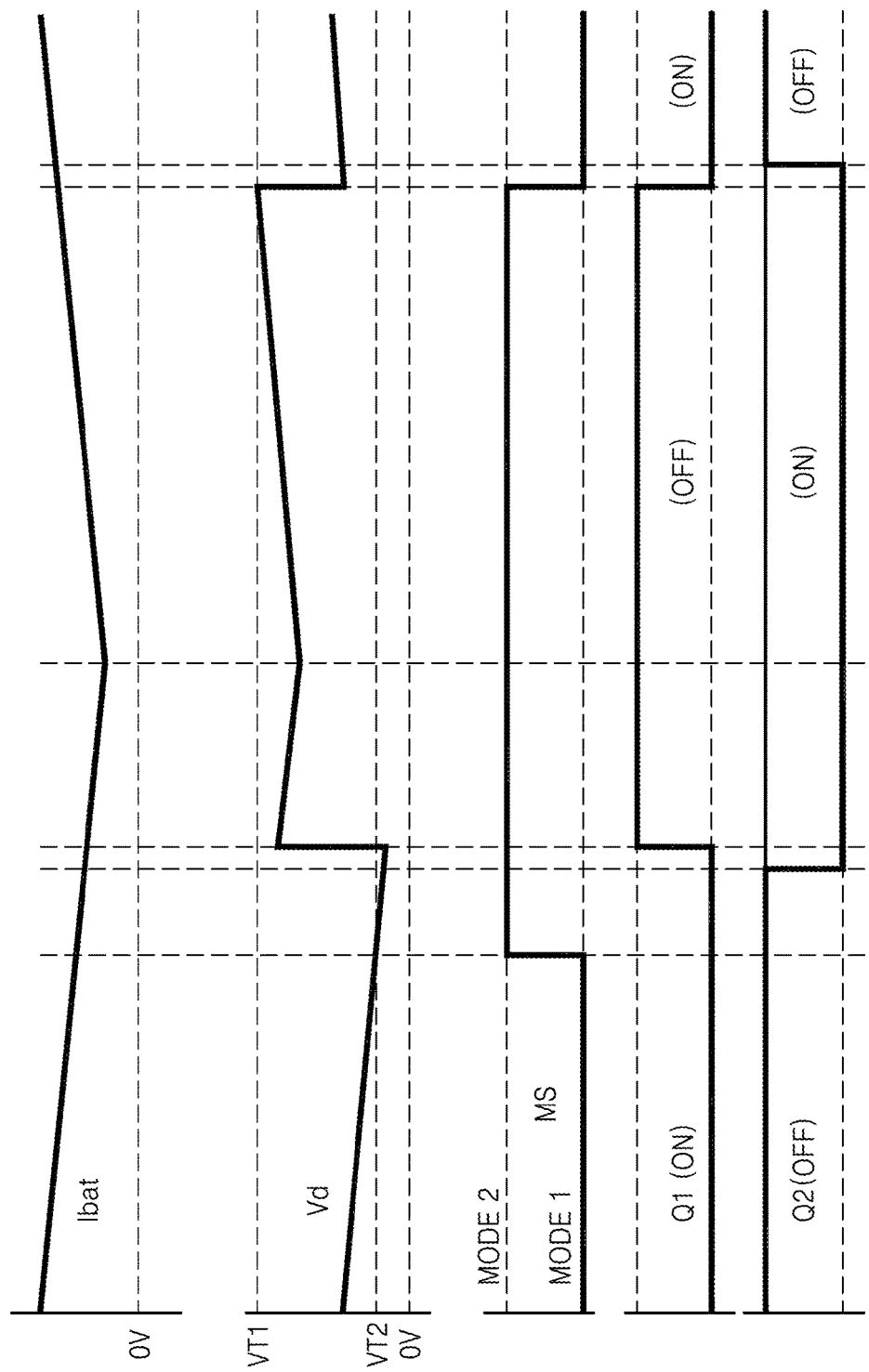
FIG. 4 is a timing chart showing the operation of the fuel gauge system illustrated in FIG. 3.

FIG. 3 is a detailed block diagram of a fuel gauge system 100A according to other example embodiments of the inventive concepts. FIG. 4 is a timing chart showing the operation of the fuel gauge system 100A illustrated in FIG. 3. The operation of the fuel gauge system 100A illustrated in FIG. 3 is similar to or the same as the operation of the fuel gauge system 100 illustrated in FIG. 2. Thus, the description below will be focused on differences between the fuel gauge systems 100 and 100A.

Referring to FIGS. 3 and 4, the fuel gauge system 100A may include a first resistive element 115A, a second resistive element 125A, a first switch 110A, a second switch 120A, a controller 140A, a fuel gauge circuit 150A, a level detector 160A, and a charging circuit 180A. The fuel gauge system 100A may automatically operate the switches 110A and 120A according to a battery current.

The controller 140A may output the first switching signal Q1 to the first switch 110A and the second switching signal Q2 to the second switch 120A to control the turning on/off of the first and second switches 110A and 120A for a substantially accurate measurement of battery current. Unlike the controller 140 illustrated in FIG. 2 which receives the mode signal MS from the AP or the platform logic, the controller 140A illustrated in FIG. 3 may receive the mode signal MS from the level detector 160A.

When the mode signal MS transits from high to low, that is, when the fuel gauge system 100A changes from the second mode to the first mode; the controller 140A may enable the first switch 110A and then disable the second switch 120A. Contrarily, when the mode signal MS transits from low to high, that is, when the fuel gauge system 100A changes from the first mode to the second mode, the controller 140A may enable the second switch 120A after waiting for the desired, or alternatively predetermined time Tdly, and disable the first switch 110A. The desired, or alternatively predetermined time Tdly may be variable.

The controller 140A may output scaling information SI to a scaler 153A based on the mode signal MS received from the level detector 160A. For instance, it is assumed that the resistance value R1 of the first resistive element 115A is about 10 mΩ and the resistance value R2 of the second resistive element 125A is about 10Ω. When the controller 140A receives a mode signal MS that is low, the controller 140A may output the scaling information SI corresponding to 1 to the scaler 153A. Contrarily, when the controller 140A receives a mode signal MS that is how, the controller 140A may output the scaling information SI corresponding to 1000 to the scaler 153A. The scaling information SI may dependent on the resistance values R1 and R2 of the first and second resistive elements 115A and 125A, and may be desired or alternatively predetermined, and variable.

The controller 140A may output the mode signal MS received from the level detector 160A to an AP (not shown) or a platform logic (not shown).

The level detector 160A may be a circuit which measures a battery current. The level detector 160A may be connected to both ends of the first and second resistive elements 115A and 125A. Here, the both ends of the first and second resistive elements 115A and 125A may be the measurement node NM and the battery node NB, respectively.

The level detector 160A may detect potentials of both ends of the first and second resistive elements 115A and 125A. The level detector 160A may determine whether the fuel gauge system 100A is in the first mode or in the second mode based on a potential difference between both ends of the first and second resistive elements 115A and 125A. For instance, when the potential difference between both ends of the first and second resistive elements 115A and 125A is greater than a first threshold VT1, the level detector 160A may determine that the fuel gauge system 100A is in the first mode. When the potential difference between both ends of the first and second resistive elements 115A and 125A is less than a second threshold VT2, the level detector 160A may determine that the fuel gauge system 100A is in the second mode. The first threshold VT1 may be greater than the second threshold VT2. The level detector 160A may output the mode signal MS to the controller 140A.

The fuel gauge circuit 150A may include an amplifier 151A, an ADC 152A, and the scaler 153A. The amplifier 151A may be connected to both ends of the respective first and second resistive elements 115A and 125A. Here, both ends of the first and second resistive elements 115A and 125A may be the measurement node NM and the battery node NB. The amplifier 151A may sense potentials at both ends of the first and second resistive elements 115A and 125A and output the voltage difference Vd between both ends of the first and second resistive elements 115A and 125A to the ADC 152A.

The ADC 152A may convert the voltage difference Vd received from the amplifier 151A into a digital signal. The ADC 152A may output the digital signal to the scaler 153A.

The scaler 153A may receive the scaling information SI from the ADC 152A. The scaler 153A may also receive the digital signal from the ADC 152A. The scaler 153A may scale the digital signal based on the scaling information SI. The scaler 153A may output a scaled digital signal to an AP (not shown) or a platform logic (not shown).

For instance, when the scaler 153A receives a digital signal corresponding to 4 and the scaling information SI corresponding to 1, the scaler 153A may scale 1 to 4 and output a digital signal corresponding to 4. When the scaler 153A receives a digital signal corresponding to about 0.004 and the scaling information SI corresponding to 1000, the scaler 153A may scale about 1000 to about 0.004 and output a digital signal corresponding to 4.

The operations and functions of the first resistive element 115A, the second resistive element 125A, the first switch 110A, the second switch 120A, and the charging circuit 180A illustrated in FIG. 3 are the same as those of the first resistive element 115, the second resistive element 125, the first switch 110, the second switch 120, and the charging circuit 180 illustrated in FIG. 2. Thus, the description of the first resistive element 115A, the second resistive element 125A, the first switch 110A, the second switch 120A, and the charging circuit 180A will be omitted to avoid redundancy.

The voltage difference Vd output from the amplifier 151A, the mode signal MS, the first switch 110A, and the second switch 120A will be described with reference to FIG. 4 on the assumption that the battery current Ibat decreases and increases over time. As the battery current Ibat decreases, the voltage difference Vd corresponding to the potential difference between both ends of the first and second resistive elements 115A and 125A created by the flow of the battery current Ibat also decreases. Here, both ends of the first and second resistive elements 115A and 125A may be the measurement node NM and the battery node NB. At this time, the fuel gauge system 100A may be in the first node.

Since the first switch 110A has been enabled and the second switch 120 has been disabled, the battery current Ibat flows only in the first resistive element 115A. Accordingly, the voltage difference Vd output from the amplifier 151A is the same as the potential difference between both ends of the first resistive element 115A. When the voltage difference Vd is less than the second threshold VT2, the fuel gauge system 100A enters the second mode. At this time, the controller 140A may wait for the desired, or alternatively predetermined time Tdly, and enable the second switch 120A and disable the first switch 110A, as described above, in order to prevent malfunction.

The controller 140A staggers the enabling of the second switch 120A and the disabling of the first switch 110A in order to prevent an error occurring when switches are disabled at substantially the same time. For instance, when the controller 140A enables the second switch 120A prior to the first switch 110A, the battery current Ibat flows only in the first resistive element 115A and the voltage difference Vd does not change discretely. When the controller 140A disables the first switch 110A thereafter, the battery current Ibat flows in both the first and second resistive elements 115A and 125A and the voltage difference Vd changes discretely.

As the battery current Ibat increases, the voltage difference Vd output from the amplifier 151A due to the flow of the battery current Ibat also increases. At this time, it is assumed that the fuel gauge system 100A is in the second node. In other words, since the first switch 110A has been disabled and the second switch 120 has been enabled, the battery current Ibat flows in both the first and second resistive elements 115A and 125A.

When the voltage difference Vd is greater than the first threshold VT1, the fuel gauge system 100A enters the first mode. At this time, the controller 140A may enable the first switch 110A and disable the second switch 120A, as described above. The controller 140A may wait for a desired, or alternatively predetermined time as in the second mode, but there is substantially no wait time in the description below.

The controller 140A staggers the enabling of the first switch 110A and the disabling of the second switch 120A in order to substantially prevent an error occurring when switches are disabled at the same time. When the controller 140A first enables the first switch 110A, the battery current Ibat flows only in the first resistive element 115A and the voltage difference Vd changes discretely. Thereafter, when the controller 140A disables the second switch 120A, the battery current Ibat flows in the first resistive element 115A continually and the voltage difference Vd changes continuously.

Figure 5:
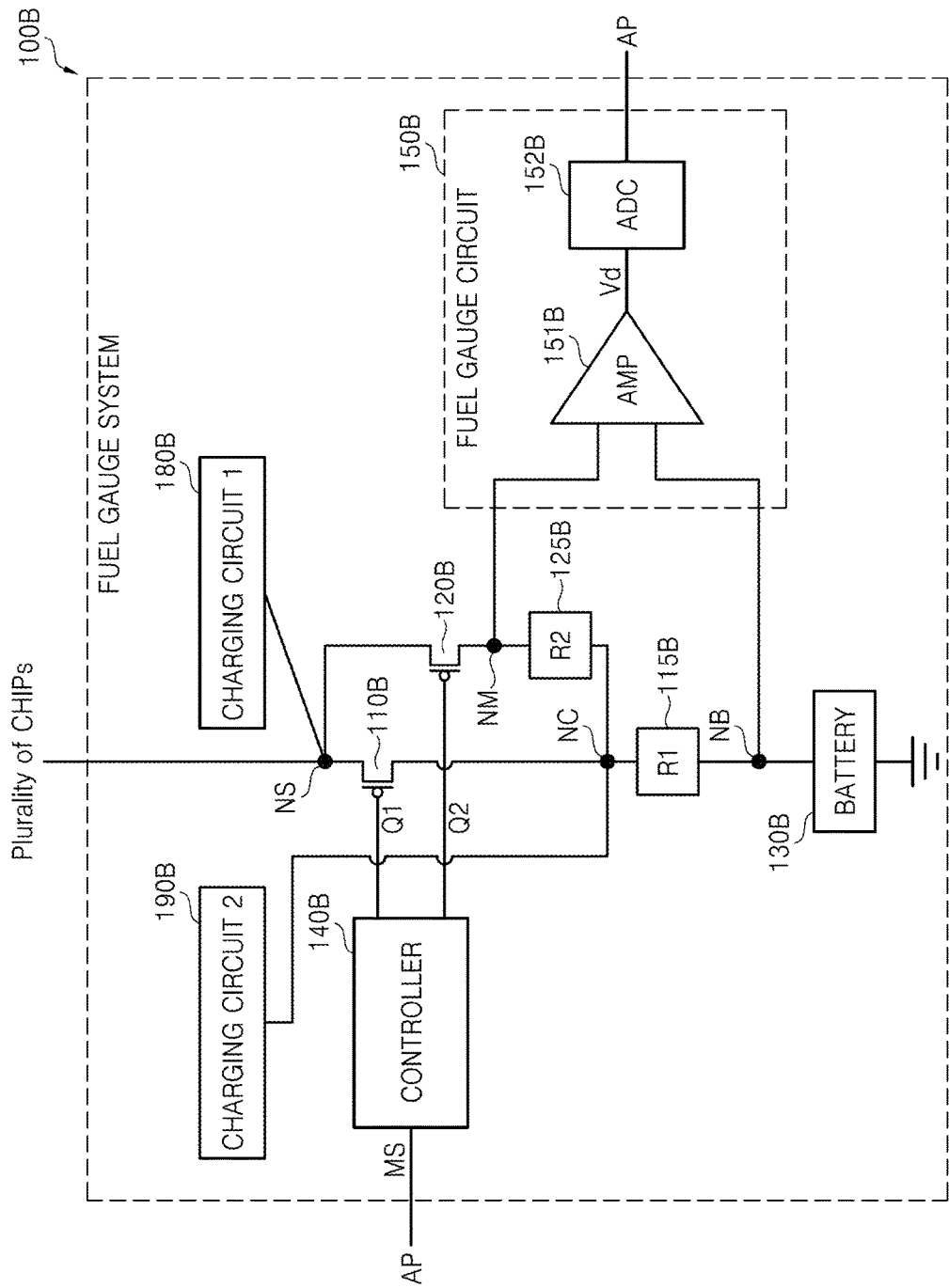
FIG. 5 is a detailed block diagram of a fuel gauge system according to example embodiments of the inventive concepts.

FIG. 5 is a detailed block diagram of a fuel gauge system 100B according to example embodiments of the inventive concepts. The operation of the fuel gauge system 100B illustrated in FIG. 5 is similar to or the same as the operation of the fuel gauge system 100 illustrated in FIG. 2. Thus, the description below will be focused on differences between the fuel gauge systems 100 and 100B.

Referring to FIG. 5, the fuel gauge system 100B may include a first resistive element 115B, a second resistive element 125B, a first switch 110B, a second switch 120B, a controller 140B, a fuel gauge circuit 150B, a first charging circuit 180B, and a second charging circuit 190B. The first charging circuit 180B and the second charging circuit 190B may perform substantially the same functions as the charging circuit 180 illustrated in FIG. 2.

The second charging circuit 190B may charge a battery 130B using a different external power supply (not shown) than the first charging circuit 180B uses. The second charging circuit 190B may charge the battery 130B through a different path than the first charging circuit 180B charges. The second charging circuit 190B may be connected, for example directly connected to a node, i.e., the central node NC between the first resistive element 115B and the second resistive element 125B. The second charging circuit 190B may be used for quick charge.

The operations and functions of the first resistive element 115B, the second resistive element 125B, the first switch 110B, the second switch 120B, the controller 140B, and the fuel gauge circuit 150B illustrated in FIG. 5 are substantially the same as the operations and functions of the first resistive element 115, the second resistive element 125, the first switch 110, the second switch 120, the controller 140, and the fuel gauge circuit 150 illustrated in FIG. 2. Thus, the description of the first resistive element 115B, the second resistive element 125B, the first switch 110B, the second switch 120B, the controller 140B, and the fuel gauge circuit 150B will be omitted to avoid redundancy.

Figure 6:
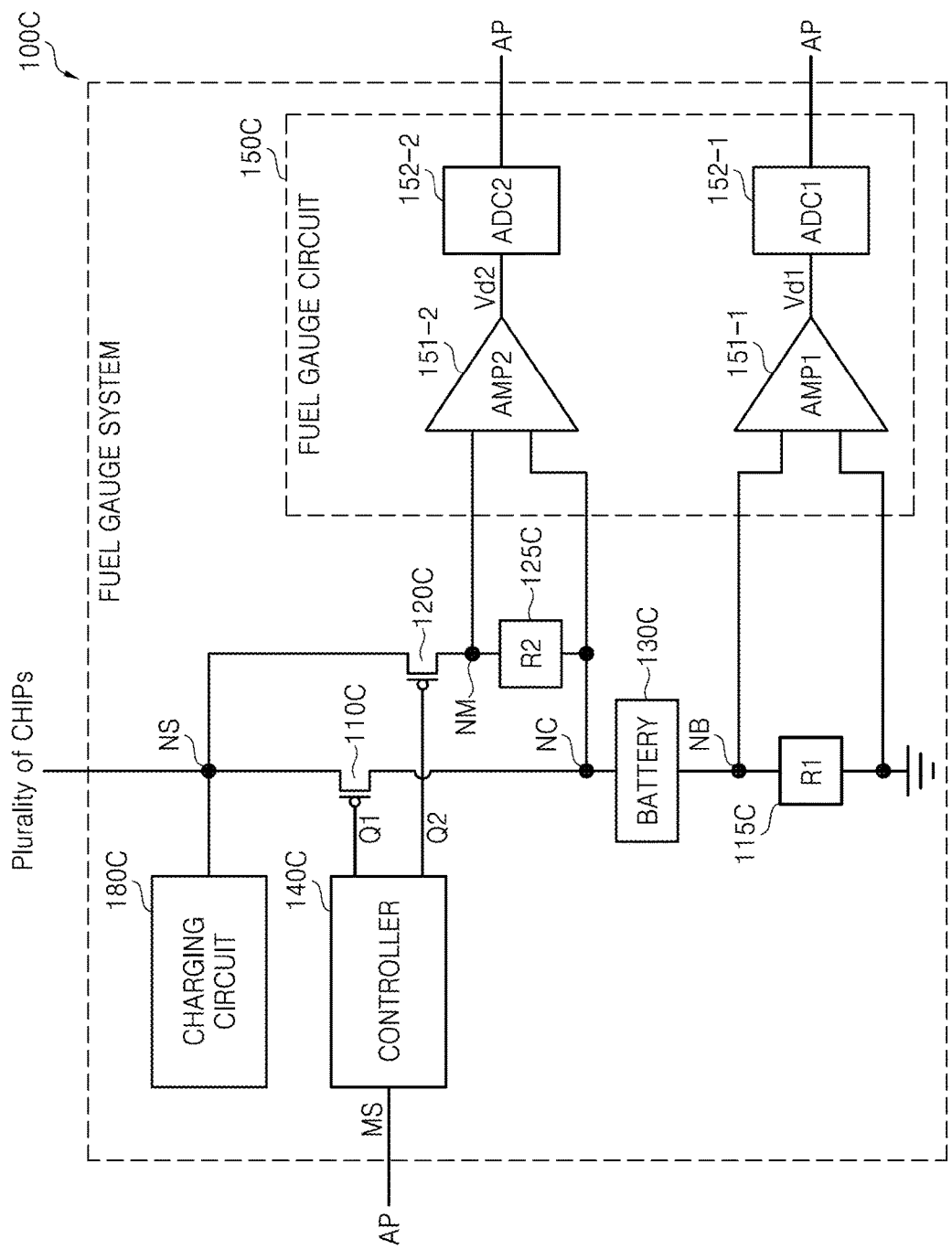
FIG. 6 is a detailed block diagram of a fuel gauge system, according example embodiments of the inventive concepts.

FIG. 6 is a detailed block diagram of a fuel gauge system 100C according to example embodiments of the inventive concepts. The operation of the fuel gauge system 100C illustrated in FIG. 6 is similar to or the same as the operation of the fuel gauge system 100 illustrated in FIG. 2. Thus, the description below will be focused on differences between the fuel gauge systems 100 and 100C.

Referring to FIG. 6, the fuel gauge system 100C may include a first resistive element 115C, a second resistive element 125C, a first switch 110C, a second switch 120C, a controller 140C, a fuel gauge circuit 150C, and a charging circuit 180C. The first resistive element 115C may be placed between a battery 130C and the ground.

The fuel gauge circuit 150C may measure a battery current flowing in the first resistive element 115C and the second resistive element 125C. The fuel gauge circuit 150C may include a first amplifier 151-1, a second amplifier 151-2, a first ADC 152-1, and a second ADC 152-2. The fuel gauge circuit 150C may be connected to both ends of the first resistive element 115C and both ends of the second resistive element 125C.

The first amplifier 151-1 may be connected to both ends of the first resistive element 115C, may sense potentials of both ends of the first resistive element 115C, and may output a first voltage difference Vd1 corresponding to a potential difference between both ends of the first resistive element 115C to the first ADC 152-1. The second amplifier 151-2 may be connected to both ends of the second resistive element 125C, may sense potentials of both ends of the second resistive element 125C, and may output a second voltage difference Vd2 corresponding to a potential difference between both ends of the second resistive element 125B to the second ADC 152-2. The second voltage difference Vd2 output from the second amplifier 151-2 to the second ADC 152-2 may be 0 in the first mode.

The first ADC 152-1 may convert the first voltage difference Vd1 received from the first amplifier 151-1 into a first digital signal. The second ADC 152-2 may convert the second voltage difference Vd2 received from the second amplifier 151-2 into a second digital signal. The first and second ADCs 152-1 and 152-2 may respectively output the first digital signal and the second digital signal to an AP (not shown) or a platform logic (not shown).

The operations and functions of the second resistive element 125C, the first switch 110C, the second switch 120C, the controller 140C, and the charging circuit 180C illustrated in FIG. 6 are substantially the same as the operations and functions of the second resistive element 125, the first switch 110, the second switch 120, the controller 140, and the charging circuit 180 illustrated in FIG. 2. Thus, the description of the second resistive element 125C, the first switch 110C, the second switch 120C, the controller 140C, and the charging circuit 180C will be omitted to avoid redundancy.

Figure 7:
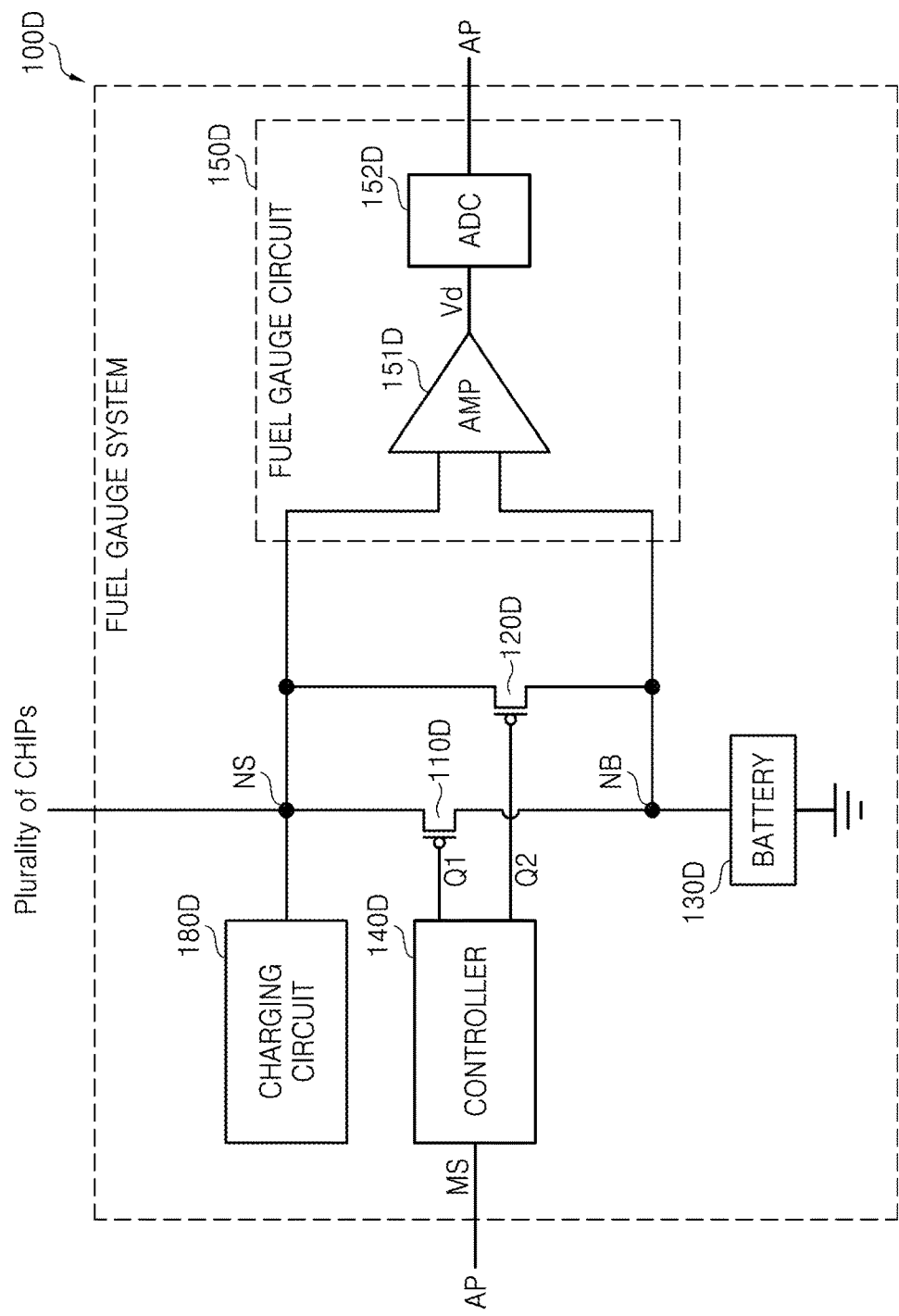
FIG. 7 is a detailed block diagram of a fuel gauge system, according to example embodiments of the inventive concepts.

FIG. 7 is a detailed block diagram of a fuel gauge system 100D according to example embodiments of the inventive concepts. The operation of the fuel gauge system 100D illustrated in FIG. 7 is similar to or the same as the operation of the fuel gauge system 100 illustrated in FIG. 2. Thus, description will be focused on differences between the fuel gauge systems 100 and 100D.

Referring to FIG. 7, the fuel gauge system 100D may include a first switch 110D, a second switch 120D, a controller 140D, a fuel gauge circuit 150D, and a charging circuit 180D. The first switch 110D may be connected in series to a battery 130D and the second switch 120D may be connected in parallel to the first switch 110D.

The first switch 110D may be enabled when the first switching signal Q1 is low and the second switch 120D may be enabled when the second switching signal Q2 is low. The first switch 110D may be a transistor that functions as a first resistor when it is enabled. The second switch 120D may be a transistor that functions as a second resistor when it is enabled. A second resistance value of the second resistor may be greater than a first resistance value of the first resistor.

The controller 140D may output the first switching signal Q1 to the first switch 110D and the second switching signal Q2 to the second switch 120D to control on/off of the first and second switches 110D and 120D for a substantially accurate measurement of a battery current.

The fuel gauge circuit 150D may be connected to both ends of the first switch 110D or both ends of the second switch 120D. The fuel gauge circuit 150D may include an amplifier 151D and an ADC 152D.

The amplifier 151D may receive potentials from both ends of the first switch 110D or from both ends of the second switch 120D. The amplifier 151D may sense the potentials from both ends of the first switch 110D or from both ends of the second switch 120D and may output the voltage difference Vd corresponding to the potential difference between both ends to the ADC 152D.

The ADC 152D may convert the voltage difference Vd received from the amplifier 151D into a digital signal. The ADC 152D may output the digital signal to an AP (not shown) or a platform logic (not shown).

The operations and functions of the controller 140D, the fuel gauge circuit 150D, and the charging circuit 180D illustrated in FIG. 7 are the same as the operations and functions of the controller 140, the fuel gauge circuit 150, and the charging circuit 180 illustrated in FIG. 2. Thus, the description of the controller 140D, the fuel gauge circuit 150D, and the charging circuit 180D will be omitted to avoid redundancy.

Furthermore, a program (computer-readable program) according to an example embodiment of the inventive concepts may be a PC-based program or an application dedicated to a mobile terminal. Accordingly, an application related to current measurement may be implemented in a program form that operates independently of a particular application. It may be implemented to allow an operation on the particular application.

In addition, according to an example embodiment of inventive concepts, an application associated with a server system for measuring current may be performed by controlling the user terminal. For example, this application may execute one or more processors configured to perform one or more aspects of the features described herein.

The units (or devices) described herein may be implemented using hardware components, at least one processor, such as the application processor AP included in the plurality of chips 200, executing software components, and/or a combination thereof. For example, the portable electronic device 10 may be implemented by processing circuitry such as a processor, a controller, an arithmetic logic unit (ALU), a digital signal processor, a microcomputer, a field programmable gate array (FPGA), a programmable logic unit, a microprocessor or any other device capable of responding to and executing instructions in a defined manner. A processing device may run an operating system (OS) and one or more software applications that run on the OS. The processing device also may access, store, manipulate, process, and create data in response to execution of the software. For the sake of easy understanding, an embodiment of the inventive concepts is exemplified as one processing device is used; however, one skilled in the art will appreciate that a processing device may include multiple processing elements and multiple types of processing elements. For example, the application processor (AP) included in the plurality of chips 200 may include multiple processors or a processor and a controller. In addition, other processing configurations are possible, such as parallel processors.

The software may include a computer program, a piece of code, an instruction, or some combination thereof, for independently or collectively instructing or configuring the processing device to operate as desired. Software and/or data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and data may be stored by one or more computer readable recording mediums.

The methods according to example embodiments may be implemented in the format of program instruction executable through various processing circuitry and may be recorded in a computer-readable medium. The computer-readable medium may also include program instructions, data files, data structures, and the like independently or in the format of combination. The program instructions recorded in the medium may be those specially designed and constructed for the embodiment or may be well-known and available to those skilled in the computer software arts. Examples of the computer-readable medium may include magnetic media such as hard disks, floppy disks, and magnetic tape; optical media such as CD ROM disks and DVD; magneto-optical media such as floptical disks; and hardware devices that are specialized to store and perform program instructions, such as read-only memory (ROM), random access memory (RAM), flash memory, and the like. Examples of program instructions may include both machine code produced by a compiler and high-level code executed by the computer using an interpreter. The described fuel gauge system 100 may be configured as one or more modules or units to perform the operations of the above-described example embodiments, and vice versa.

As described above, according to example embodiments of the inventive concepts, a fuel gauge system uses a plurality of resistive elements in a portable electronic device using a battery, thereby increasing a measuring sensitivity and substantially accurately measuring a battery current. Accordingly, when a micro battery current (i.e., less than about 1 mA) flows, the battery current can be more accurately measured. In addition, a delay is set in the operation timing of a plurality of switches, so that an error that may occur when all of the switches are turned off is prevented.

While the inventive concepts has been particularly shown and described with reference to example embodiments thereof, it will be understood by those of ordinary skill in the art that various changes in forms and details may be made therein without departing from the spirit and scope of the inventive concepts as defined by the following claims.

What is claimed is:

1. A fuel gauge system for measuring an amount of current in a battery, the fuel gauge system comprising:
   a first resistive element connected in series to the battery;
   a second resistive element connected in series to the first resistive element;
   a first switch connected in parallel to the second resistive element and configured to control a current flowing in the second resistive element;
   a second switch connected in series to the second resistive element and configured to control the current flowing in the second resistive element;
   a controller configured to output a first switching signal to the first switch and output a second switching signal to the second switch; and
   a fuel gauge circuit configured to measure a battery current flowing in the first resistive element and in the second resistive element.

2. The fuel gauge system of claim 1, wherein the first resistive element is directly connected to the second resistive element, and
   the fuel gauge circuit includes:
   an amplifier configured to sense potentials of both ends of the first and second resistive elements; and
   an analog-to-digital converter configured to output a digital signal based on a voltage difference received from the amplifier.

3. The fuel gauge system of claim 1, wherein the battery is between the first resistive element and the second resistive element, and
   the fuel gauge circuit includes:
   a first amplifier configured to sense potentials of both ends of the first resistive element; and
   a second amplifier configured to sense potentials of both ends of the second resistive element.

4. The fuel gauge system of claim 2, wherein the controller is configured to enable the first switch and to disable the second switch when a mode signal corresponding to a first mode is received, and the controller is configured to enable the second switch after a desired time and to disable the first switch when a mode signal corresponding to a second mode is received.

5. The fuel gauge system of claim 4, further comprising a level detector configured to receive potential values of both ends of the first resistive element and potential values of both ends of the second resistive element, configured to detect a level of the battery current, and configured to output the mode signal to the controller.

6. The fuel gauge system of claim 5, wherein the fuel gauge circuit further comprises a scaler configured to scale the digital signal received from the analog-to-digital converter according to scaling information received from the controller, and the controller is configured to output a desired scaling information to the scaler according to the mode signal.

7. The fuel gauge system of claim 2, further comprising:
a first charging circuit connected to the first switch; and
a second charging circuit connected to the first resistive element through a different path than a path connecting the first charging circuit to the first resistive element.

8. A portable electronic device, the portable electronic device comprising:
a fuel gauge system configured to measure an amount of current in a battery; and
a plurality of chips connected to the fuel gauge system, wherein the fuel gauge system includes:
a first resistive element connected in series to the battery;
a second resistive element connected in series to the first resistive element;
a first switch connected in parallel to the second resistive element and configured to control a current flowing in the second resistive element;
a second switch connected in series to the second resistive element and configured to control the current flowing in the second resistive element;
a controller configured to output a first switching signal to the first switch and to output a second switching signal to the second switch; and
a fuel gauge circuit configured to measure a battery current flowing in the first resistive element and in the second resistive element.

9. The portable electronic device of claim 8, wherein the first resistive element is directly connected to the second resistive element, and
the fuel gauge circuit includes:
an amplifier configured to sense potentials of both ends of the first and second resistive elements; and
an analog-to-digital converter configured to output a digital signal based on a voltage difference received from the amplifier.

10. The portable electronic device of claim 9, wherein the controller is configured to enable the first switch and to disable the second switch when a mode signal corresponding to a first mode is received, and the controller is configured to enable the second switch after waiting for a desired time and to disable the first switch when a mode signal corresponding to a second mode is received.

11. The portable electronic device of claim 10, wherein the fuel gauge system further comprises a level detector configured to receive potential values of both ends of the first resistive element and potential values of both ends of the second resistive element, to detect a level of the battery current, and to output the mode signal to the controller.

12. The portable electronic device of claim 11, wherein the fuel gauge circuit further comprises a scaler configured to scale the digital signal received from the analog-to-digital converter according to scaling information received from the controller, and the controller is configured to output a desired scaling information to the scaler according to the mode signal.

13. A fuel gauge system comprising:
a first switch connected in series to a first resistor and to a battery, and in parallel to a second resistor;
a second switch connected in series to the first and second resistors, and in parallel to the first switch; and
a fuel gauge circuit connected in parallel to the first and second resistors and configured to measure a battery current flowing in the first resistor and in the second resistor.

14. The fuel gauge system of claim 13, further comprising a controller configured to output a first switching signal to the first switch and to output a second switching signal to the second switch.

15. The fuel gauge system of claim 13, wherein the first switch is a first transistor configured to operate as the first resistor when enabled, and the second switch is a second transistor configured to operate as the second resistor when enabled, the second transistor having a greater resistance than the first transistor.

16. The fuel gauge system of claim 14, further comprising:
an amplifier configured to sense potentials of opposite ends of the first and second resistors; and
an analog-to-digital converter configured to output a digital signal based on a voltage difference received from the amplifier.

17. The fuel gauge system of claim 16, wherein the amplifier comprises:
a first amplifier configured to sense potentials of opposite ends of the first resistor; and
a second amplifier configured to sense potentials of opposite ends of the second resistor.

18. The fuel gauge system of claim 16, further comprising:
a level detector configured to receive potential values of opposite ends of the first resistor and potential values of opposite ends of the second resistor, configured to detect a level of the battery current, and configured to output one of a first mode signal and a second mode signal to the controller.

19. The fuel gauge system of claim 18, further comprising:
a scaler configured to scale the digital signal received from the analog-to-digital converter according to scaling information received from the controller, the controller being configured to output a desired scaling information to the scaler according to one of the first mode signal and the second mode signal.

20. The fuel gauge system of claim 13, further comprising:
a first charging circuit connected to the first switch; and
a second charging circuit connected to the first resistor through a different path than a path connecting the first, charging circuit to the first resistor.

* * * * *